United States Patent
Maegawa et al.

(10) Patent No.: US 10,186,517 B2
(45) Date of Patent: *Jan. 22, 2019

(54) SEMICONDUCTOR MEMORY DEVICE AND METHOD FOR MANUFACTURING THE SAME

(71) Applicant: TOSHIBA MEMORY CORPORATION, Minato-ku (JP)

(72) Inventors: Takashi Maegawa, Suzuka (JP); Hiroshi Nakaki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/614,144

(22) Filed: Jun. 5, 2017

(65) Prior Publication Data

US 2017/0271350 A1  Sep. 21, 2017

Related U.S. Application Data

(63) Continuation of application No. 15/059,670, filed on Mar. 3, 2016, now Pat. No. 9,698,150.

(60) Provisional application No. 62/246,427, filed on Oct. 26, 2015.

(51) Int. Cl.
   H01L 27/11556   (2017.01)
   H01L 27/11582   (2017.01)
   H01L 29/10      (2006.01)
   H01L 27/1157    (2017.01)

(52) U.S. Cl.
   CPC .... H01L 27/11556 (2013.01); H01L 27/1157 (2013.01); H01L 27/11582 (2013.01); H01L 29/1033 (2013.01)

(58) Field of Classification Search
   CPC ............... H01L 27/11556; H01L 27/1157
   USPC ............................................ 257/314
   See application file for complete search history.

(56) References Cited

U.S. PATENT DOCUMENTS

| 8,237,211 B2 | 8/2012 | Fukuzumi |
| 8,264,031 B2 | 9/2012 | Kidoh |
| 8,426,908 B2 | 4/2013 | Higashi et al. |
| 9,698,150 B2 * | 7/2017 | Maegawa ......... H01L 27/11556 |
| 2012/0003831 A1 | 1/2012 | Kang |

FOREIGN PATENT DOCUMENTS

JP   2006-86674   3/2006

* cited by examiner

*Primary Examiner* — Anthony Ho
(74) *Attorney, Agent, or Firm* — Oblon, McClelland, Maier & Neustadt, L.L.P.

(57) ABSTRACT

According to one embodiment, a semiconductor memory device includes a substrate, a first insulating film, a stacked body, and a first pillar. At least a portion of an upper layer portion of the substrate is conductive. The first insulating film is provided in a portion of the substrate. The stacked body includes conductive films and insulating films stacked alternately in a first direction. The conductive films and the insulating films are provided on the substrate and on the first insulating film. The first pillar pierces the stacked body in the first direction. The first pillar includes a first lower end portion and a first extension portion. The first lower end portion is disposed inside the first insulating film. The first extension portion is disposed inside the stacked body.

12 Claims, 17 Drawing Sheets

SEMICONDUCTOR MEMORY DEVICE AND METHOD FOR MANUFACTURING THE SAME

CROSS-REFERENCE TO RELATED APPLICATION

This application is a Continuation of U.S. application Ser. No. 15/059,670, filed on Mar. 3, 2016, and is based upon and claims the benefit of priority from U.S. Provisional Patent Application 62/246,427, filed on Oct. 26, 2015; the entire contents of each of which are incorporated herein by reference.

FIELD

Embodiments relate to a semiconductor memory device and a method for manufacturing the same.

BACKGROUND

A stacked semiconductor memory device that includes a semiconductor pillar and a stacked body including conductive films and insulating films stacked alternately around the semiconductor pillar has been proposed.

DETAILED DESCRIPTION

According to one embodiment, a semiconductor memory device includes a substrate, a first insulating film, a stacked body, and a first pillar. At least a portion of an upper layer portion of the substrate is conductive. The first insulating film is provided in a portion of the substrate. The stacked body includes conductive films and insulating films stacked alternately in a first direction. The conductive films and the insulating films are provided on the substrate and on the first insulating film. The first pillar pierces the stacked body in the first direction. The first pillar includes a first lower end portion and a first extension portion. The first lower end portion is disposed inside the first insulating film. The first extension portion is disposed inside the stacked body.

Embodiments will now be described with reference to the drawings.

First Embodiment

Figure 1:
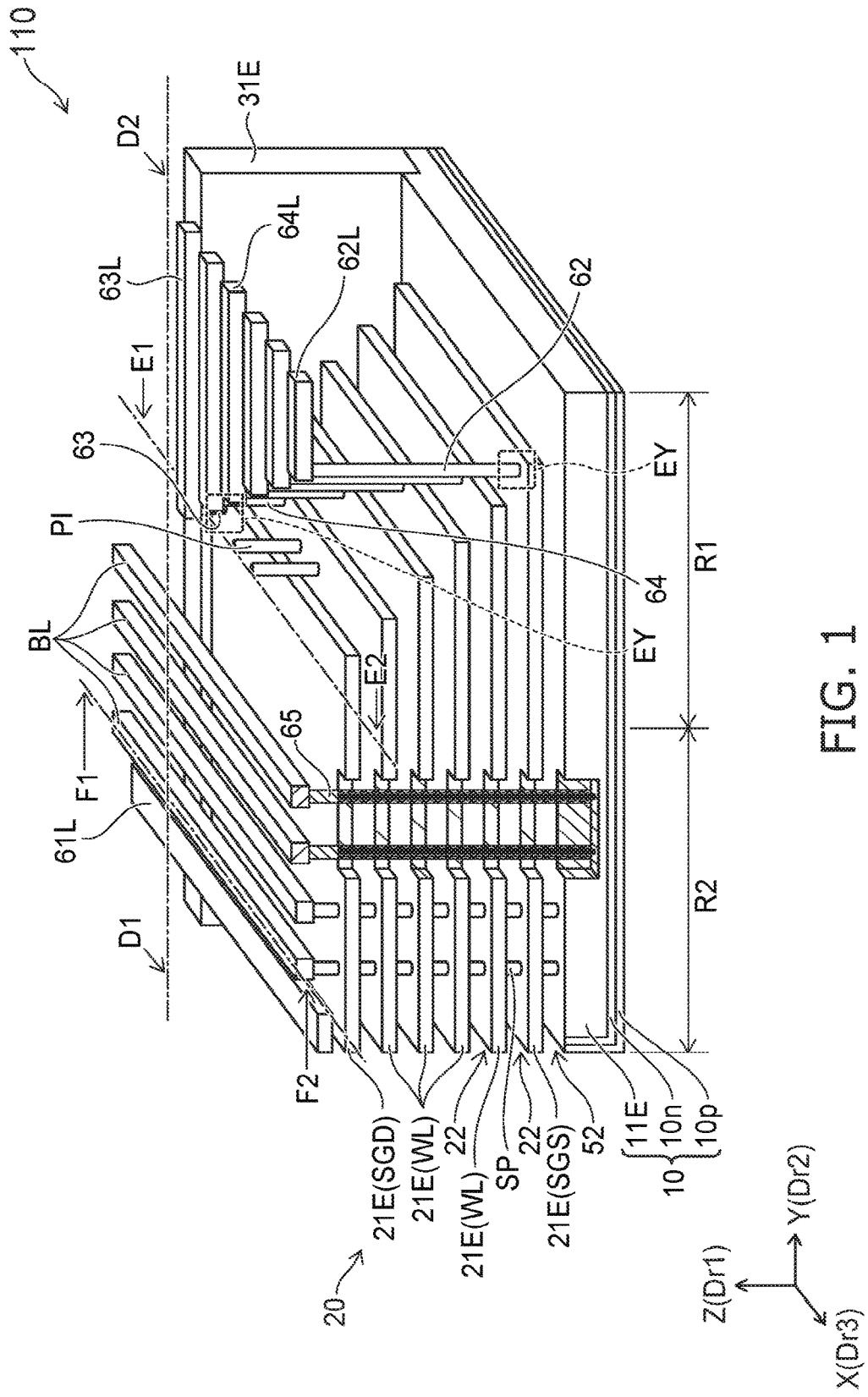
FIG. 1 is a schematic perspective view showing a semiconductor memory device according to a first embodiment.

FIG. 1 is a schematic perspective view showing a semiconductor memory device according to a first embodiment.

As shown in FIG. 1, multiple second pillars SP are provided in the semiconductor memory device 110 according to the first embodiment.

The direction in which the multiple second pillars SP extend is taken as a "first direction Dr1." A direction intersecting the first direction Dr1 is taken as a "second direction Dr2." A direction intersecting the first direction Dr1 and the second direction Dr2 is taken as a "third direction Dr3." For example, the "first direction Dr1" is taken as a "Z-direction." A direction orthogonal to the Z-direction is taken as an "X-direction." A direction orthogonal to the Z-direction and the X-direction is taken as a "Y-direction."

In this specification, the state in which a second component is provided on a first component includes the state in which the second component physically contacts the first component and the state in which a third component is provided between the second component and the first component.

A substrate 10 is provided in the example of the semiconductor memory device 110. The substrate 10 includes a p-type portion 10p, an n-type well 10n that is provided on the p-type portion 10p, and a p-type well 11E that is provided on the n-type well 10n. At least a portion of the upper layer portion of the substrate 10 is conductive. A conductive film may be provided instead of the p-type well 11E.

A stacked body 20 is provided on the substrate 10. An insulating film 52 is provided between the stacked body 20 and the substrate 10. In the stacked body 20, a conductive film 21E and an insulating film 22 are stacked alternately in the Z-direction. The stacked body 20 includes a second region R2, and a first region R1 disposed on the Y-direction side of the second region R2. The configuration of the portion of the stacked body 20 disposed in the first region R1 is a stairstep configuration. The length along the Y-direction in the first region R1 of the conductive film 21E of the lower layer is longer than the length along the Y-direction in the first region R1 of the conductive film 21E of the upper layer. In the first region R1, a first pillar PI that pierces the first region R1 in the Z-direction is provided. In the second region R2, the second pillar SP that pierces the second region R2 in the Z-direction is provided. The second pillar SP is not provided in the first region R1. The first pillar PI is not provided in the second region R2.

In the example, the conductive film 21E of the lowermost layer of the stacked body 20 is called a source-side selection gate electrode SGS. The conductive film 21E of the uppermost layer of the stacked body 20 is called a drain-side selection gate electrode SGD. The conductive film 21E that is between the drain-side selection gate electrode SGD and the source-side selection gate electrode SGS is called a word line WL. Multiple layers of the source-side selection gate electrode SGS including the conductive film 21E of the lowermost layer may be provided. Multiple layers of the drain-side selection gate electrode SGD including the conductive film 21E of the uppermost layer may be provided.

A bit line BL is provided on the second pillar SP. The bit line BL extends in the X-direction. A contact 65 that extends in the Z-direction is provided between the second pillar SP and the bit line BL. The bit line BL and the second pillar SP are electrically connected via the contact 65.

A source electrode 31E is provided on the substrate 10. The source electrode 31E spreads in the Y-direction and the Z-direction. An interconnect 61L is provided on the source electrode 31E. The interconnect 61L extends in the X-direction. A contact (not shown) that extends in the Z-direction is provided between the source electrode 31E and the interconnect 61L. The interconnect 61L and the source electrode 31E are electrically connected via the contact.

A contact 62 is provided on an end portion EY in the Y-direction of the source-side selection gate electrode SGS. The contact 62 extends in the Z-direction. An interconnect 62L is provided on the contact 62. The interconnect 62L extends in the Y-direction. The interconnect 62L and the source-side selection gate electrode SGS are electrically connected via the contact 62.

A contact 63 is provided on the end portion EY in the Y-direction of the drain-side selection gate electrode SGD. The contact 63 extends in the Z-direction. An interconnect 63L is provided on the contact 63. The interconnect 63L extends in the Y-direction. The interconnect 63L and the drain-side selection gate electrode SGD are electrically connected via the contact 63.

A contact 64 is provided on the end portion EY in the Y-direction of the word line WL. The contact 64 extends in the Z-direction. An interconnect 64L is provided on the contact 64. The interconnect 64L extends in the Y-direction. The interconnect 64L and the word line WL are electrically connected via the contact 64.

Figure 2:
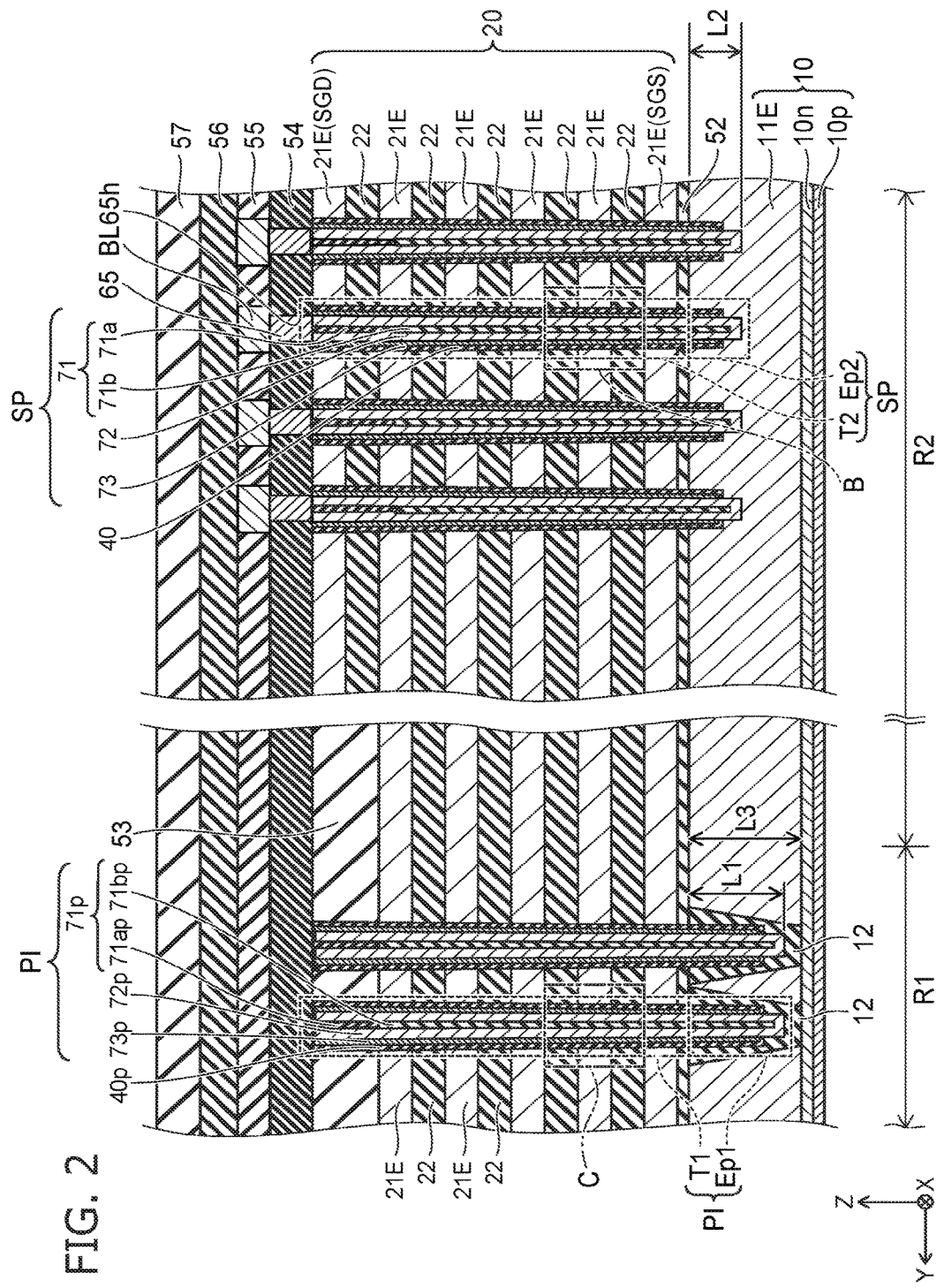
FIG. 2 is a schematic cross-sectional view along line D1-D2 shown in FIG. 1.

FIG. 2 is a schematic cross-sectional view along line D1-D2 shown in FIG. 1.

Figure 3:
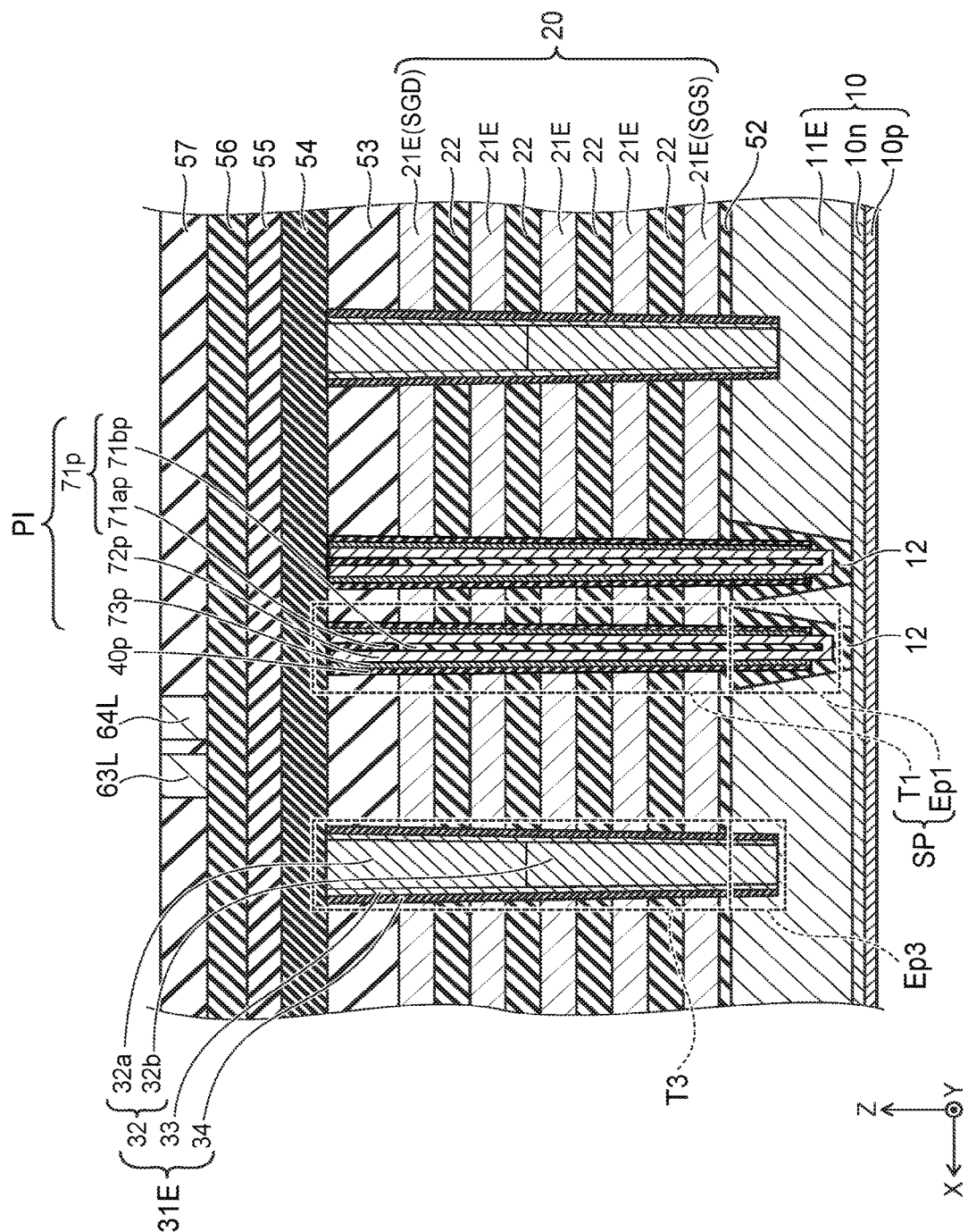
FIG. 3 is a schematic cross-sectional view along line E1-E2 shown in FIG. 1.

FIG. 3 is a schematic cross-sectional view along line E1-E2 shown in FIG. 1.

Figure 4:
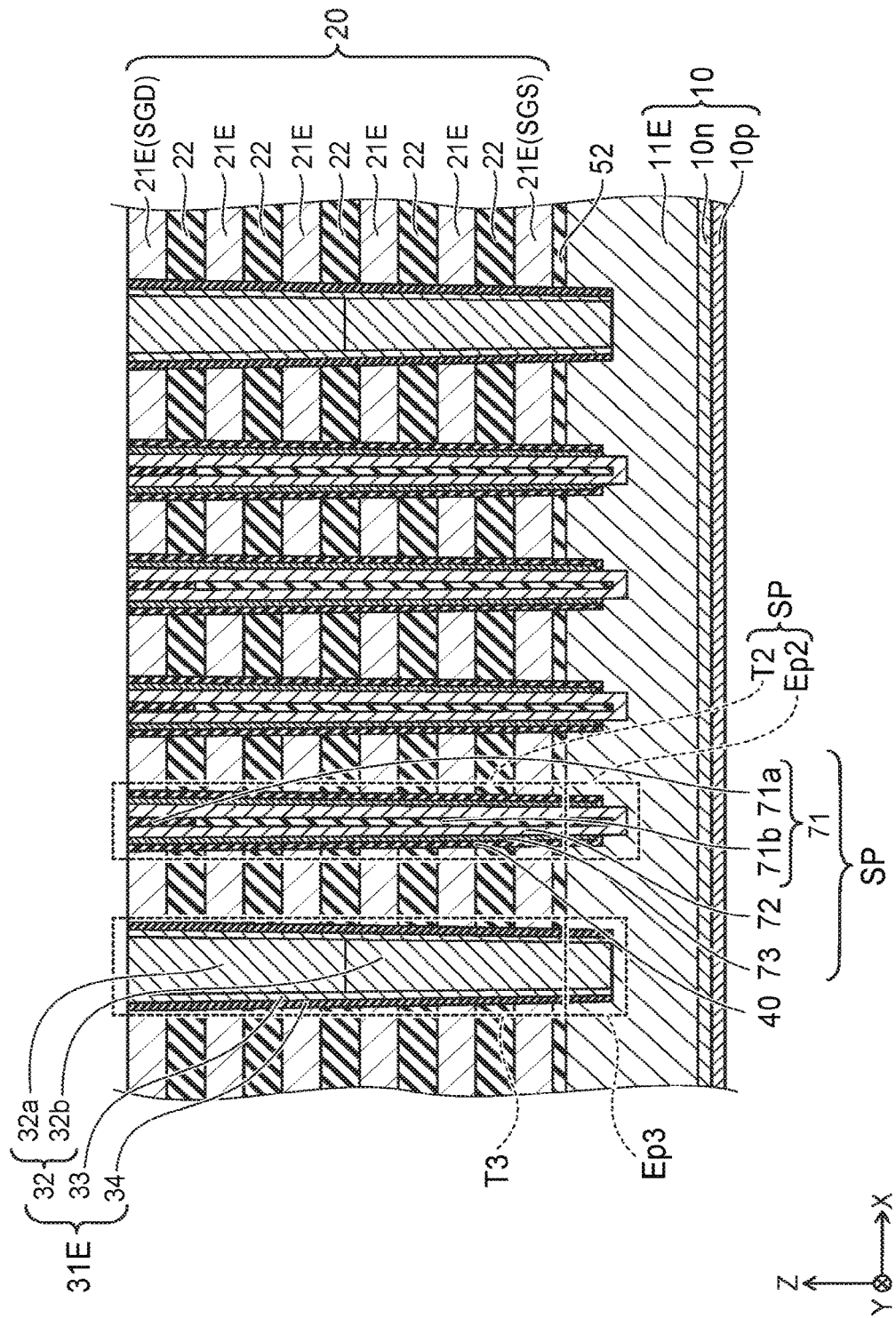
FIG. 4 is a schematic cross-sectional view along line F1-F2 shown in FIG. 1.

FIG. 4 is a schematic cross-sectional view along line F1-F2 shown in FIG. 1. FIG. 4 is a schematic XZ cross-sectional view including the second pillar SP. However, FIG. 4 shows the stacked body 20 and the portion under the stacked body 20.

As shown in FIG. 2 to FIG. 4, a STI (Shallow Trench Isolation) (an insulating film 12) is provided in a portion of the substrate 10. The insulating film 12 contacts the substrate 10. A first lower end portion Ep1 of the first pillar PI is disposed inside the insulating film 12. A first extension portion T1 which is the portion of the first pillar PI other than the first lower end portion Ep1 is disposed inside the stacked body 20. The first lower end portion Ep1 of the first pillar PI does not reach the bottom of the insulating film 12. Accordingly, the first lower end portion Ep1 is not electrically connected to the substrate 10.

A second lower end portion Ep2 of the second pillar SP is disposed inside the substrate 10. A second extension portion T2 which is the portion of the second pillar SP other than the second lower end portion Ep2 is disposed inside the stacked body 20. The second lower end portion Ep2 contacts the substrate 10 and is electrically connected to the substrate 10. The second insulating film 12 is not provided around the second lower end portion Ep2 of the second pillar SP.

A first memory film 40 is provided between the stacked body 20 and the second pillar SP. A second memory film 40p is provided between the stacked body 20 and the first pillar PI.

A first length L1 along the Z-direction of the first lower end portion Ep1 is longer than a second length L2 along the Z-direction of the second lower end portion Ep2. For example, the first length L1 is not less than 10 times the second length L2. Also, a third length L3 along the Z-direction of the insulating film 12 is longer than the second length L2.

The first pillar PI includes a core 71p, a conductive film 72p, and a conductive film 73p. The core 71p includes a core 71ap and a core 71bp that extend in the Z-direction. The core 71p that extends in the Z-direction is provided at the center of the first pillar PI. The conductive film 72p is provided around the core 71p. The conductive film 73p is provided around the conductive film 72p.

The second pillar SP includes a core 71, a conductive film 72, and a conductive film 73. The core 71 includes a core 71a and a core 71b that extend in the Z-direction. The conductive film 72 is provided around the core 71. The conductive film 73 is provided around the conductive film 72.

An insulating film 57 is provided on the stacked body 20. An insulating film 56 is provided between the insulating film 57 and the stacked body 20. An insulating film 55 is provided between the insulating film 56 and the stacked body 20. An insulating film 54 is provided between the insulating film 55 and the stacked body 20. An insulating film 53 is provided between the insulating film 54 and the stacked body 20.

The insulating film 54 is provided on the first pillar PI. Insulating films (the insulating film 12, a second inner insulating film 41p, a second outer insulating film 43p, and the insulating film 54) are provided around the first pillar PI. Therefore, the first pillar PI is electrically isolated from the substrate 10 and the conductive film 21E.

As shown in FIG. 3 and FIG. 4, as described above, the source electrode 31E is provided along the YZ plane on the substrate 10. A third lower end portion Ep3 of the source electrode 31E is disposed inside the substrate 10. A third extension portion T3 which is the portion of the source electrode 31E other than the third lower end portion Ep3 is disposed inside the stacked body 20. The third lower end portion Ep3 is electrically connected to the substrate 10.

The source electrode 31E includes a conductive film 32, a barrier metal film 33, and an insulating film 34. The conductive film 32 includes a conductive film 32a and a conductive film 32b. The conductive film 32 is provided at the center of the source electrode 31E. The barrier metal film 33 is provided between the conductive film 32 and the stacked body 20. The insulating film 34 is provided between the barrier metal film 33 and the stacked body 20.

Figure 5A:
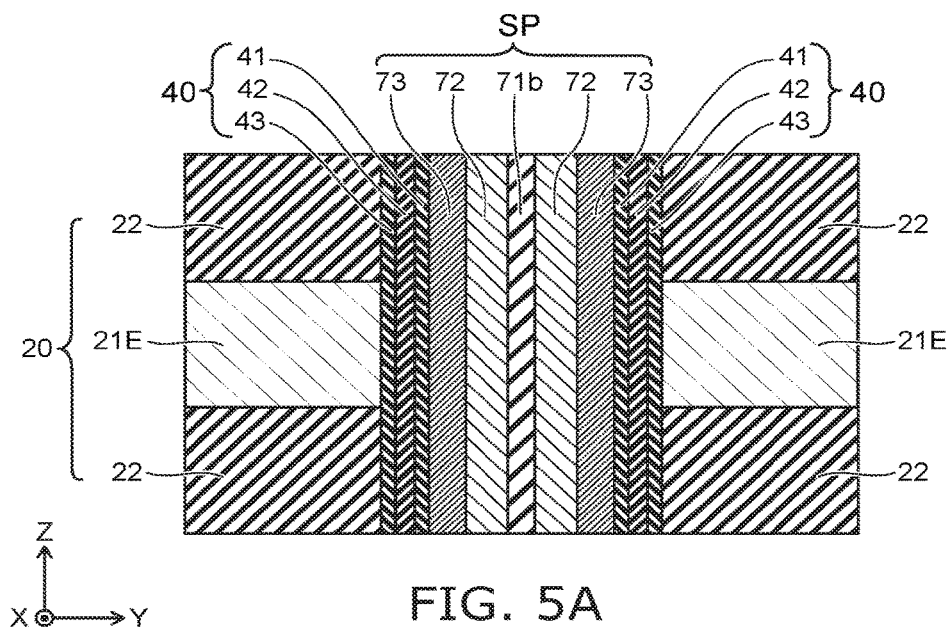
FIGS. 5A and 5B are schematic cross-sectional views showing a portion of the semiconductor memory device according to the first embodiment.
Figure 5B:
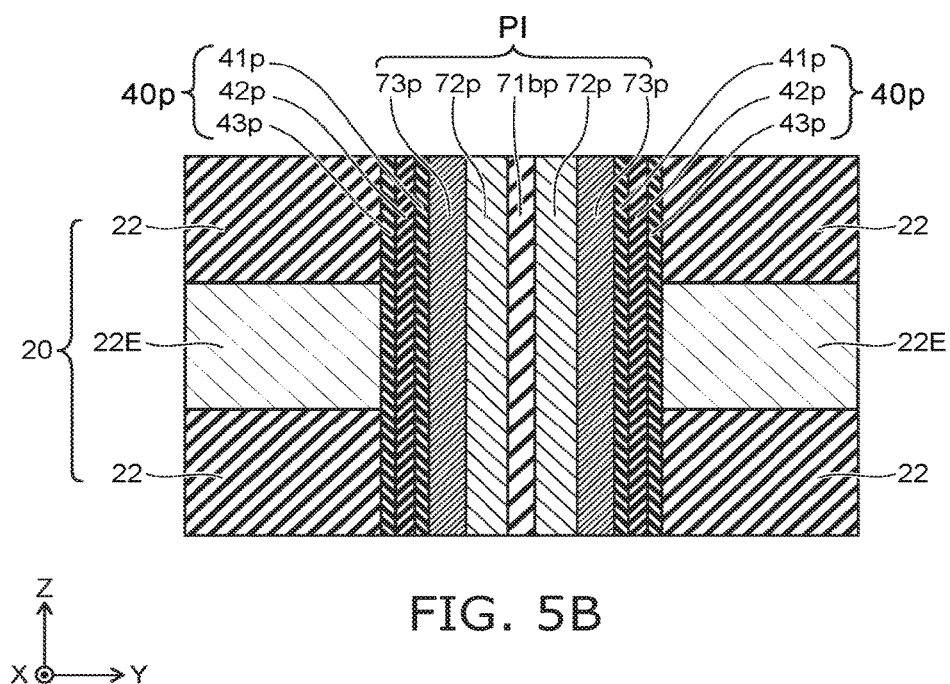

FIG. 5A and FIG. 5B are schematic cross-sectional views showing a portion of the semiconductor memory device according to the first embodiment.

FIG. 5A is a schematic cross-sectional view showing portion B shown in FIG. 2.

FIG. 5B is a schematic cross-sectional view showing portion C shown in FIG. 2.

In portion B of FIG. 2 as shown in FIG. 5A, a first outer insulating film 43 is provided between the second pillar SP and the stacked body 20. The first outer insulating film 43 is, for example, a blocking insulating film. A first intermediate film 42 is provided between the first outer insulating film 43 and the second pillar SP. The first intermediate film 42 is, for example, a charge storage film. A first inner insulating film 41 is provided between the first intermediate film 42 and the second pillar SP. The first inner insulating film 41 is, for example, a tunneling insulating film. The first inner insulating film 41, the first intermediate film 42, and the first outer insulating film 43 are included in the first memory film 40.

The blocking insulating film is a film in which a current substantially does not flow even when a voltage within the range of the drive voltage of the semiconductor memory device is applied. The charge storage film is a film that can store charge. Although the tunneling insulating film normally is insulative, the tunneling insulating film is a film in which a tunneling current flows when a prescribed voltage within the range of the drive voltage of the semiconductor memory device is applied.

In portion C of FIG. 2 as shown in FIG. 5B, the second outer insulating film 43p is provided between the first pillar PI and the stacked body 20. A second intermediate film 42p is provided between the second outer insulating film 43p and the pillar PI. The second inner insulating film 41p is provided between the second intermediate film 42p and the first pillar PI. The second inner insulating film 41p, the second intermediate film 42p, and the second outer insulating film 43p are included in the second memory film 40p.

One example of the material of each portion will now be described.

The substrate 10 includes, for example, silicon (Si). One of the conductive film 21E, the interconnects 61L to 64L, contacts 61 to 65, the bit line BL, or the source electrode 31E includes, for example, tungsten (W). One of the insulating film 12, the insulating film 22, or the insulating films 51 to 57 includes, for example, silicon oxide ($SiO_2$).

The core 71a and the core 71ap include, for example, silicon (Si) to which phosphorus (P) is added. The core 71b and the core 71bp include, for example, silicon oxide. The conductive film 72, the conductive film 73, the conductive film 72p, and the conductive film 73p include, for example, silicon.

The first inner insulating film 41, the first outer insulating film 43, the second inner insulating film 41p, and the second outer insulating film 43p include, for example, silicon oxide, silicon nitride (SiN), a metal oxide, etc.

That is, the structure inside the second pillar SP and the structure inside the first pillar PI and the materials may be the same. In other words, the structure of the core 71, the conductive film 72, the conductive film 73, and the first memory film 40 inside the second pillar SP and the structure of the core 71p, the conductive film 72p, the conductive film 73p, and the second memory film 40p inside the first pillar PI may be the same.

The materials included in the first pillar PI may be different from the materials included in the second pillar SP.

The conductive film 32a includes, for example, tungsten. The conductive film 32b includes, for example, polysilicon (p-Si). The barrier metal film 33 includes, for example, titanium (Ti), titanium nitride (TiN), or a stacked film of these elements. The insulating film 34 includes, for example, silicon oxide.

An example of a method for manufacturing the semiconductor memory device according to the first embodiment will now be described.

FIG. 6A to FIG. 15 are schematic cross-sectional views showing the method for manufacturing the semiconductor memory device according to the first embodiment.

FIG. 6A to FIG. 12 are schematic cross-sectional views along line D1-D2 shown in FIG. 1.

Figure 6A:
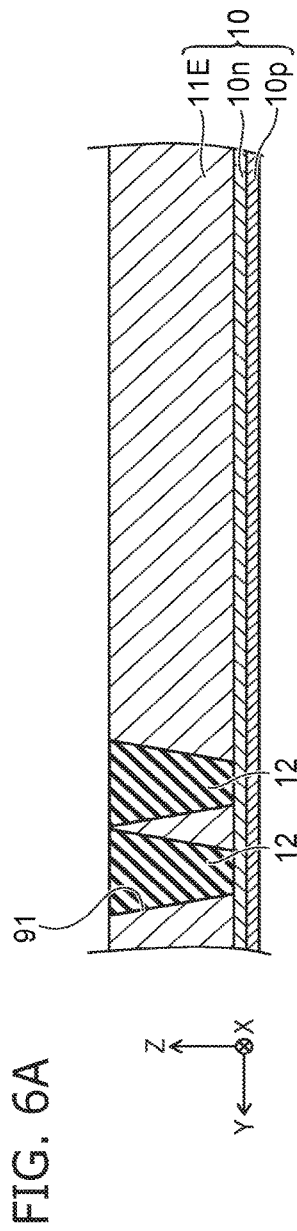
FIGS. 6A to 15 are schematic cross-sectional views showing the method for manufacturing the semiconductor memory device according to the first embodiment.

As shown in FIG. 6A, the n-type well 10n is formed on the p-type portion 10p. The p-type well 11E is formed on the n-type well 10n. For example, the wells are formed by ion implantation.

Etching of the p-type well 11E is performed. A trench 91 is made in a portion of the p-type well 11E. For example, the insulating film 12 is formed by depositing silicon oxide inside the trench 91.

Figure 6B:
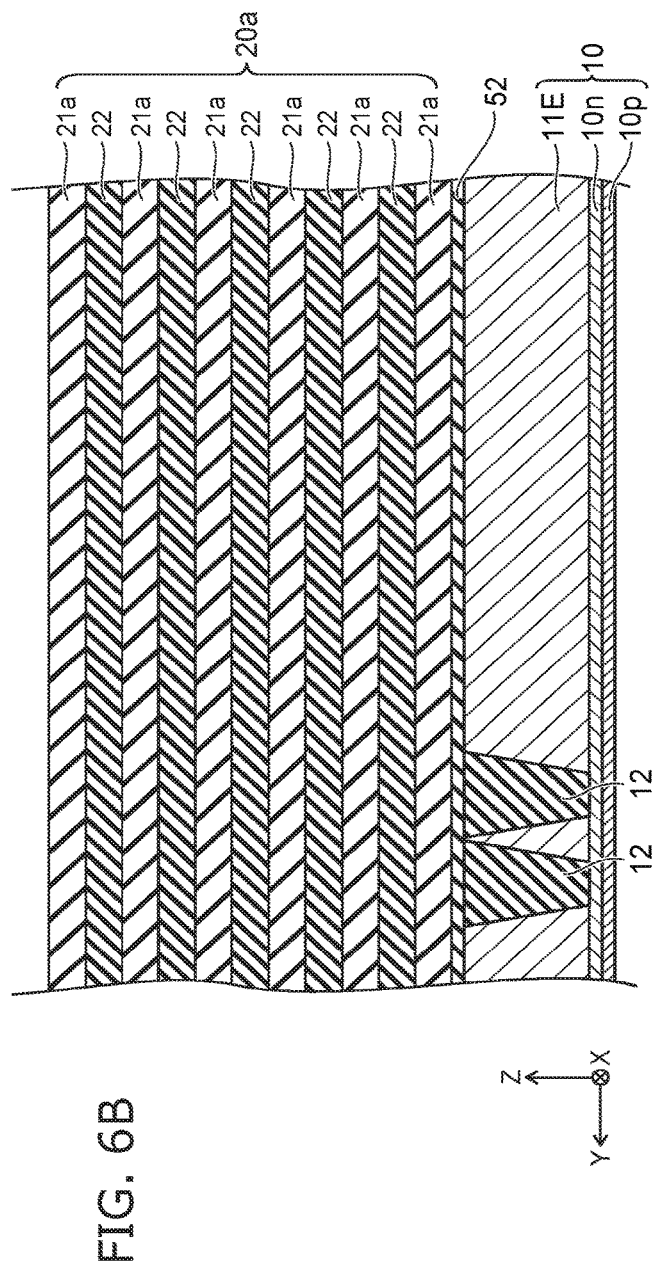

As shown in FIG. 6B, for example, the insulating film 52 is formed by depositing silicon oxide on the p-type well 11E and on the insulating film 12. For example, a stacked body 20a is formed on the insulating film 52 by stacking the insulating film 22 and a filled film 21a by CVD (Chemical Vapor Deposition). The insulating film 22 includes, for example, silicon oxide. The filled film 21a includes, for example, silicon nitride.

Figure 7:
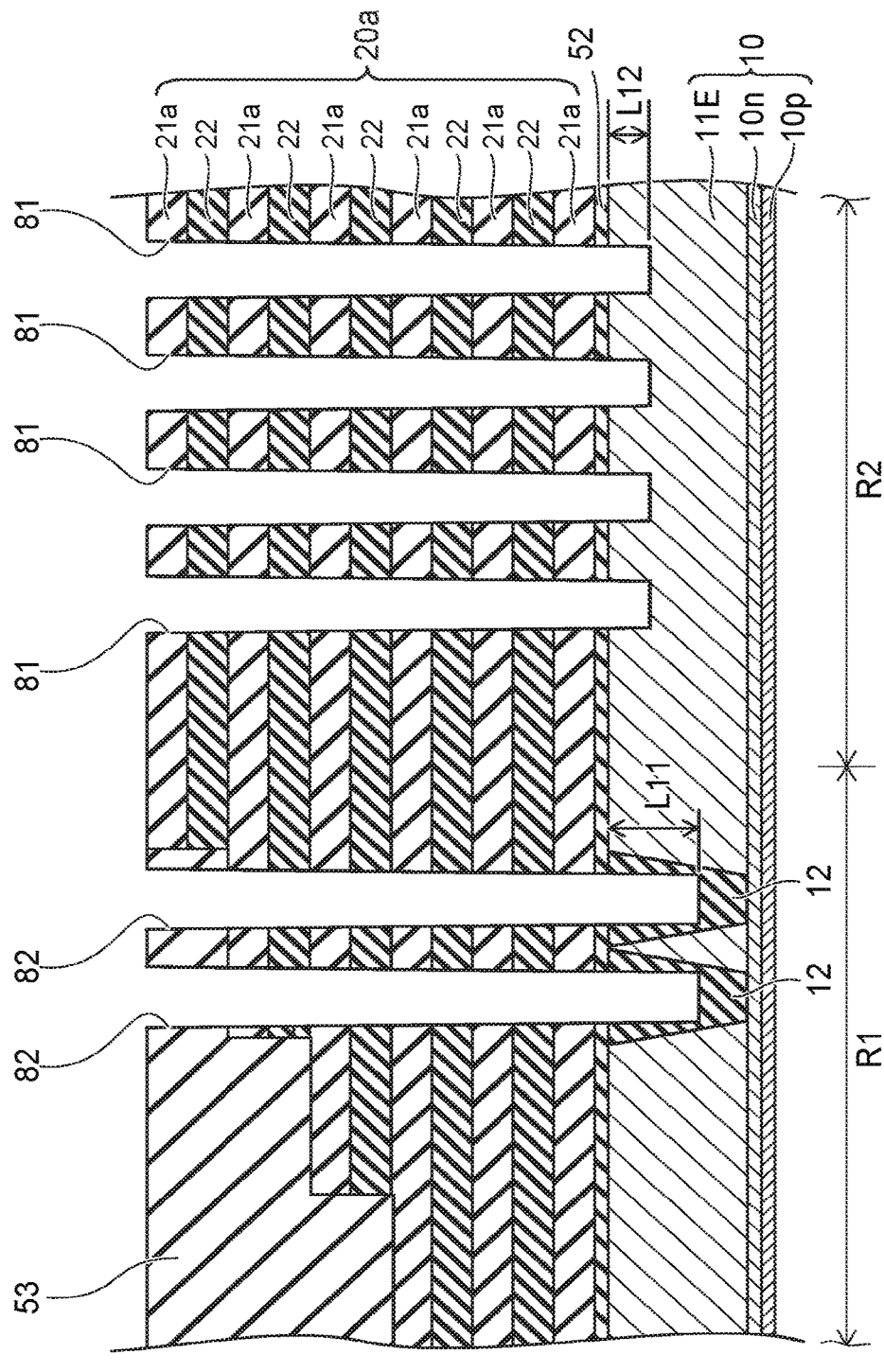

As shown in FIG. 7, the first region R1 of the stacked body 20a is patterned by etching into a stairstep configuration. For example, the insulating film 53 is formed on the stacked body 20a by depositing silicon oxide. The stacked body 20a and the insulating film 53 are planarized by CMP (Chemical Mechanical Polishing). A first hole 81 and a second hole 82 are made by using photolithography and anisotropic etching. The first hole 81 pierces the stacked body 20a in the Z-direction and reaches the p-type well 11E. The second hole 82 pierces the insulating film 53 and the stacked body 20a in the Z-direction and reaches the insulating film 12.

The anisotropic etching is performed at conditions so that the etching rate of silicon oxide ($SiO_2$) is higher than the etching rate of silicon (Si), e.g., conditions such that the etching rate of silicon oxide is about 10 times the etching rate of silicon. The substrate 10 (the p-type well 11E) includes, for example, silicon. The insulating film 12 includes, for example, silicon oxide. Therefore, the excavated amount (the amount that is removed) of the insulating film 12 is more than the excavated amount (the amount that is removed) of the p-type well 11E. Accordingly, inside the p-type well 11E, a length L11 along the Z-direction of the second hole 82 is longer than a length L12 along the Z-direction of the first hole 81.

Figure 8:
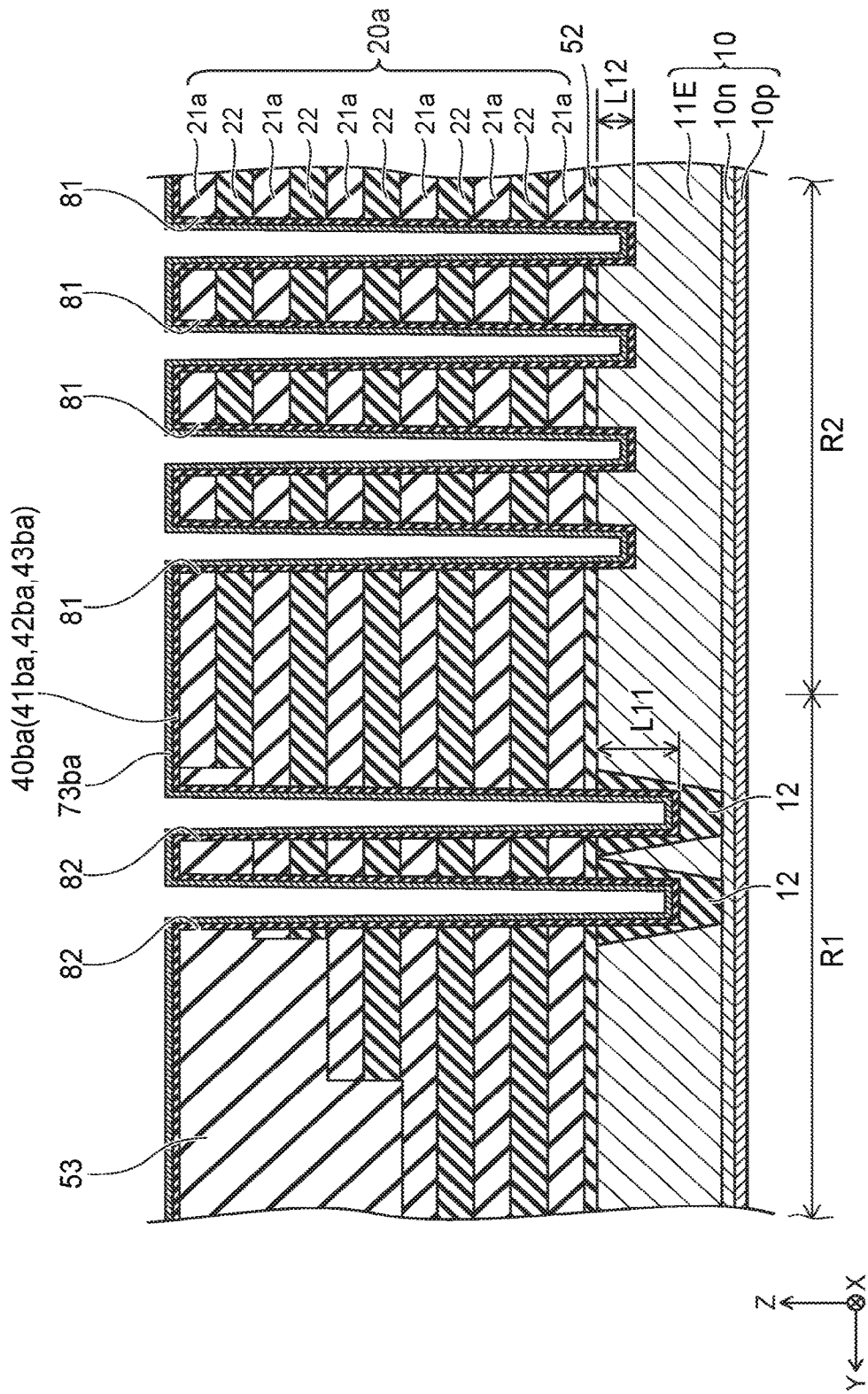

As shown in FIG. 8, a memory base film 40ba is formed on the stacked body 20a, inside the hole 81, and inside the hole 82 by forming an outer base insulating film 43ba, an intermediate base film 42ba, and an inner base insulating film 41ba in this order. A semiconductor base film 73ba is formed on the memory base film 40ba.

Figure 9:
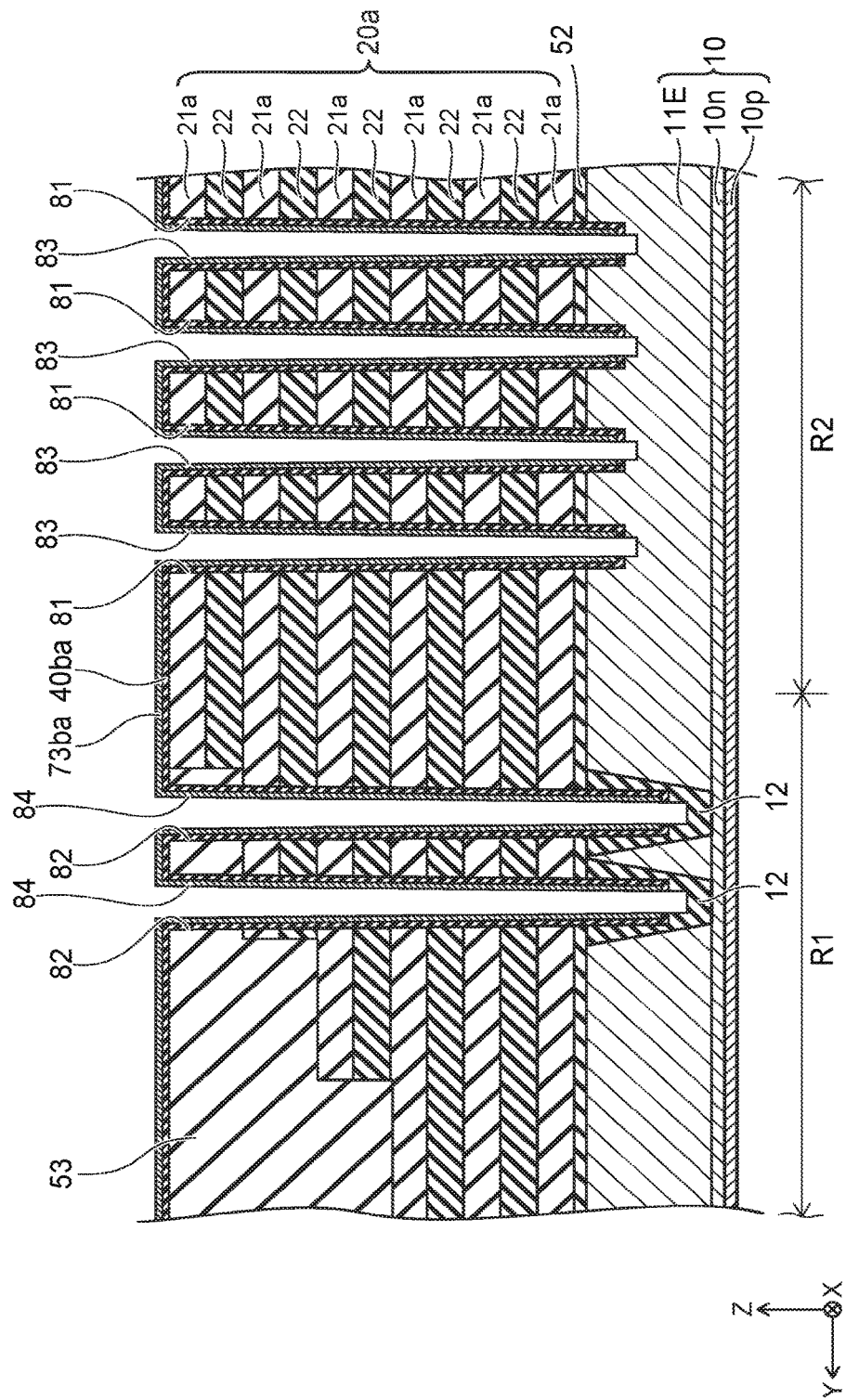

As shown in FIG. 9, for example, anisotropic etching is performed to make a hole 83 that pierces the bottom of the semiconductor base film 73ba and the memory base film 40ba bottom inside the hole 81 and reaches the p-type well 11E. A hole 84 that pierces the bottom of the semiconductor base film 73ba and the memory base film 40ba bottom inside the hole 82 and reaches the insulating film 12 is made.

Figure 10:
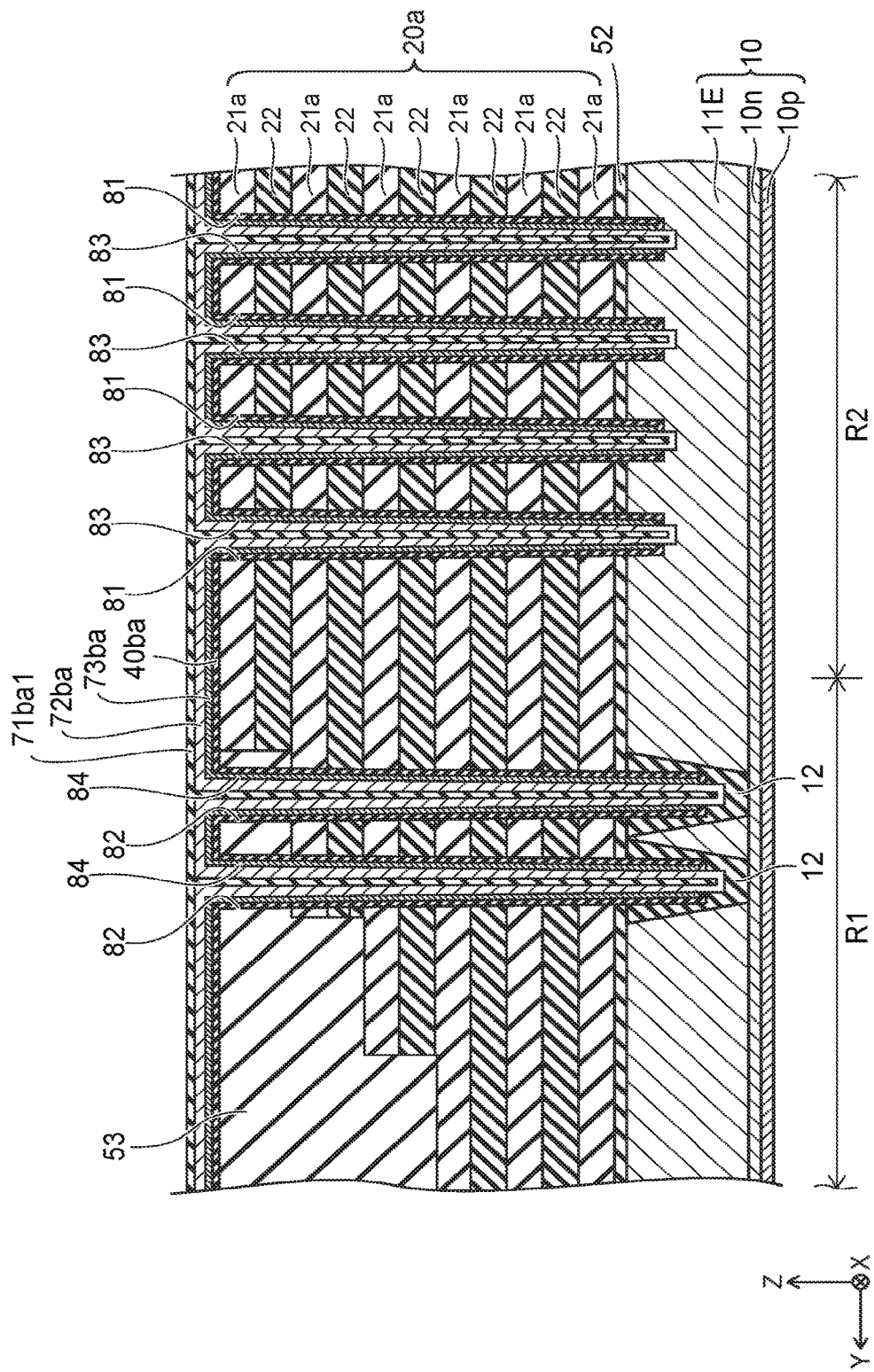

As shown in FIG. 10, a semiconductor base film 72ba is formed inside the hole 83 and the hole 84. A core base 71ba1 is formed by depositing an insulating material onto the semiconductor base film 72ba to fill the hole 83 and the hole 84.

Figure 11:
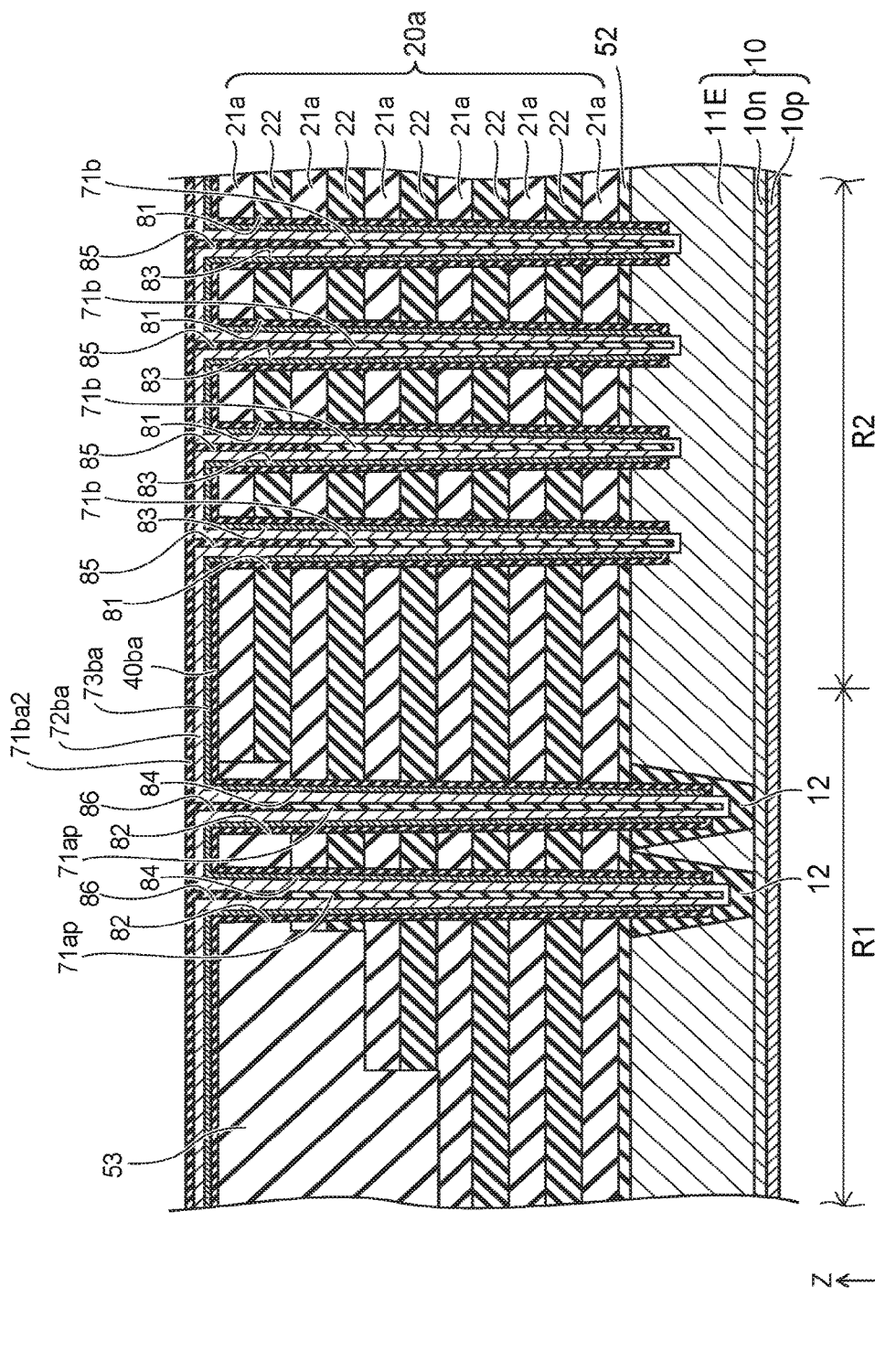

As shown in FIG. 11, a portion of the core base 71ba1 is removed by performing etch-back. Thereby, a hole 85 and a hole 86 are made. The core base 71ba1 that remains inside the hole 83 is called the core 71b. The core base 71ba1 that remains inside the hole 84 is called the core 71bp. A core base 71ba2 is formed by filling the interior of the hole 85 and the interior of the hole 86.

Figure 12:
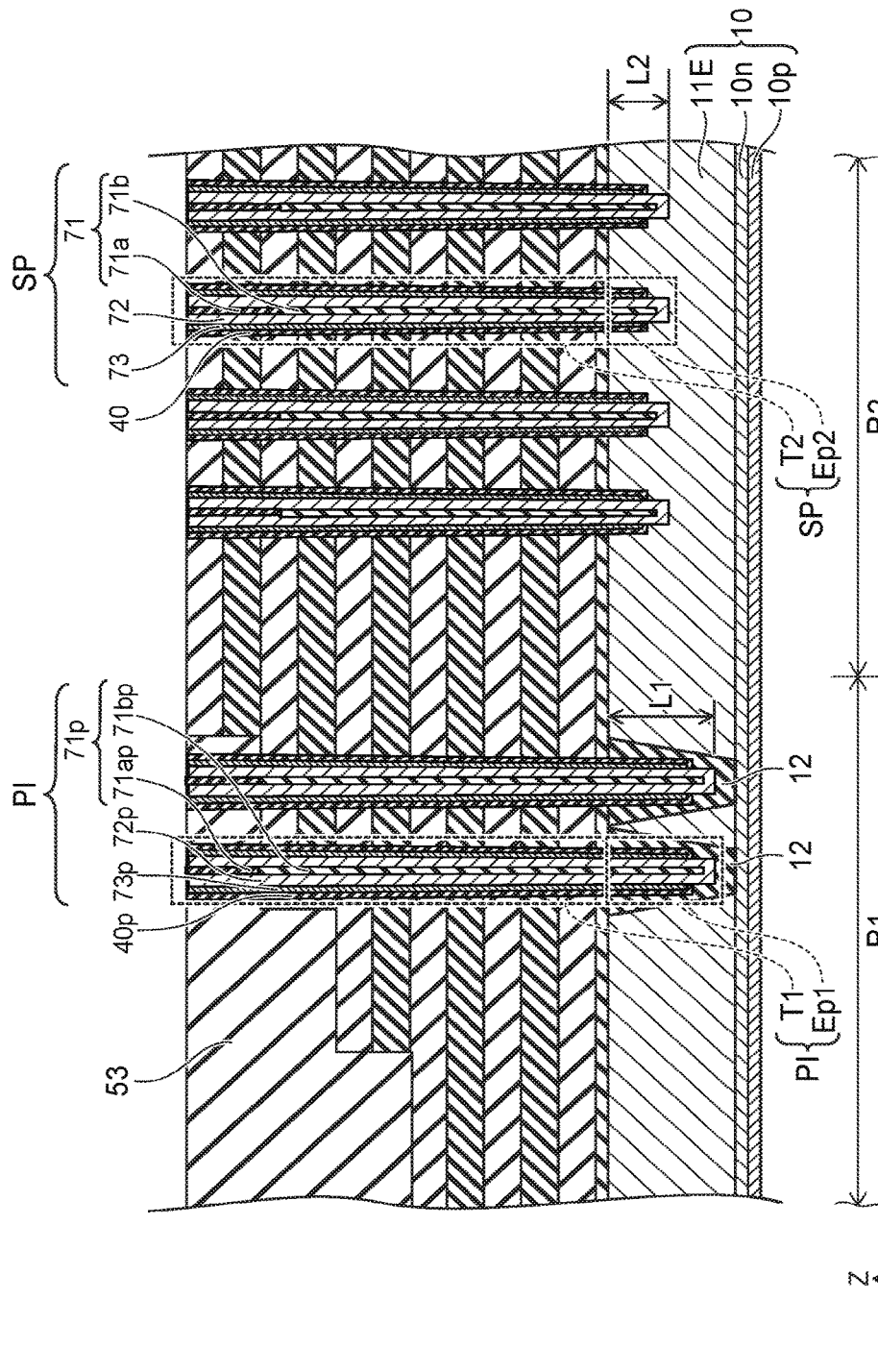

As shown in FIG. 12, for example, etching is performed by RIE (Reactive Ion Etching). Thereby, the first pillar PI and the second pillar SP are formed. Inside the p-type well 11E, the first pillar PI is formed to be deeper than the second pillar SP. In other words, the length L1 along the Z-direction of the first lower end portion Ep1 of the first pillar PI disposed inside the p-type well 11E is longer than the length L2 along the Z-direction of the second lower end portion Ep2 of the second pillar SP. The first pillar PI is used as a pillar when removing the filled film 21a in a subsequent process and suppresses the collapse of the structure.

Figure 13:
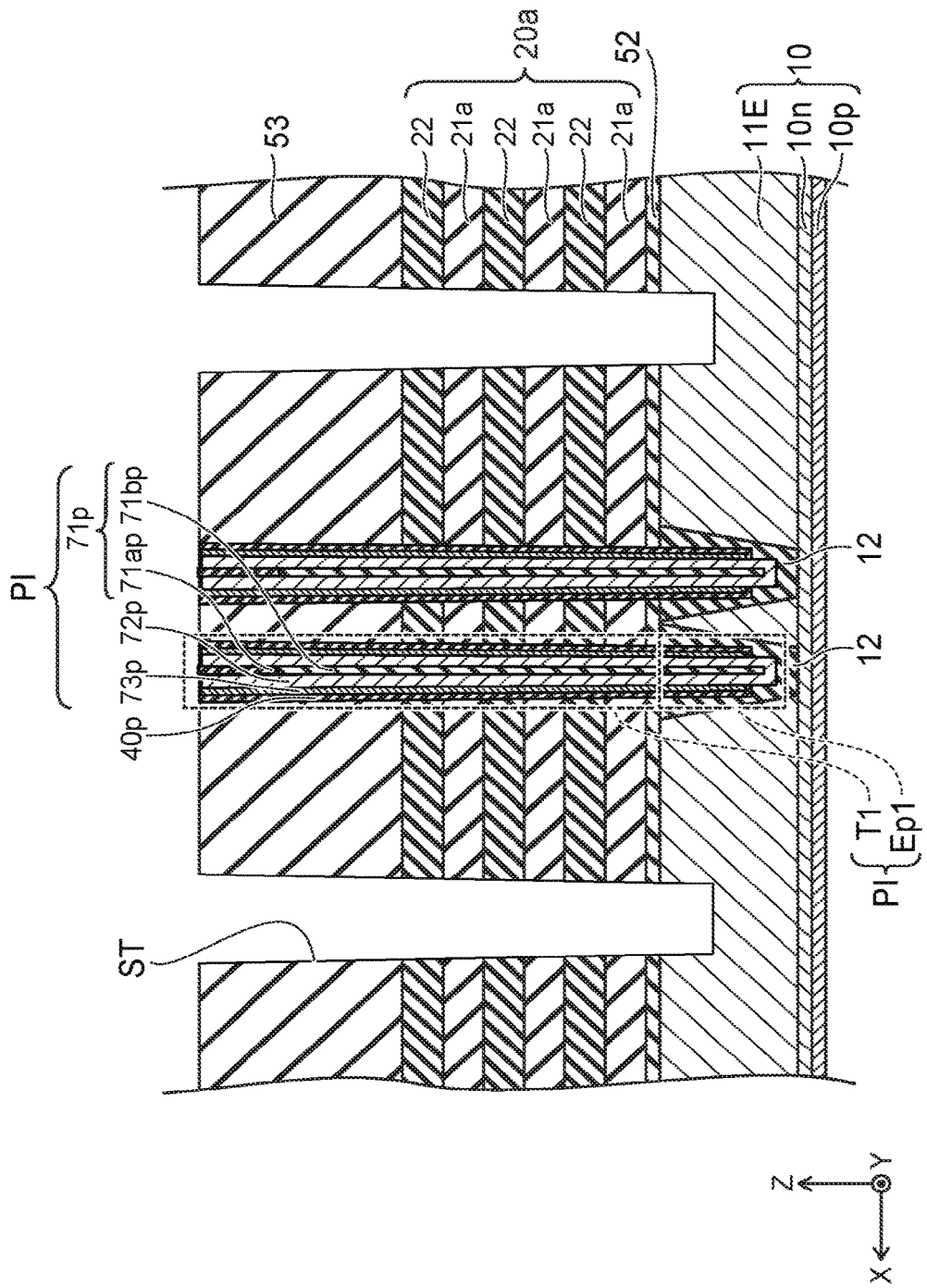
Figure 14:
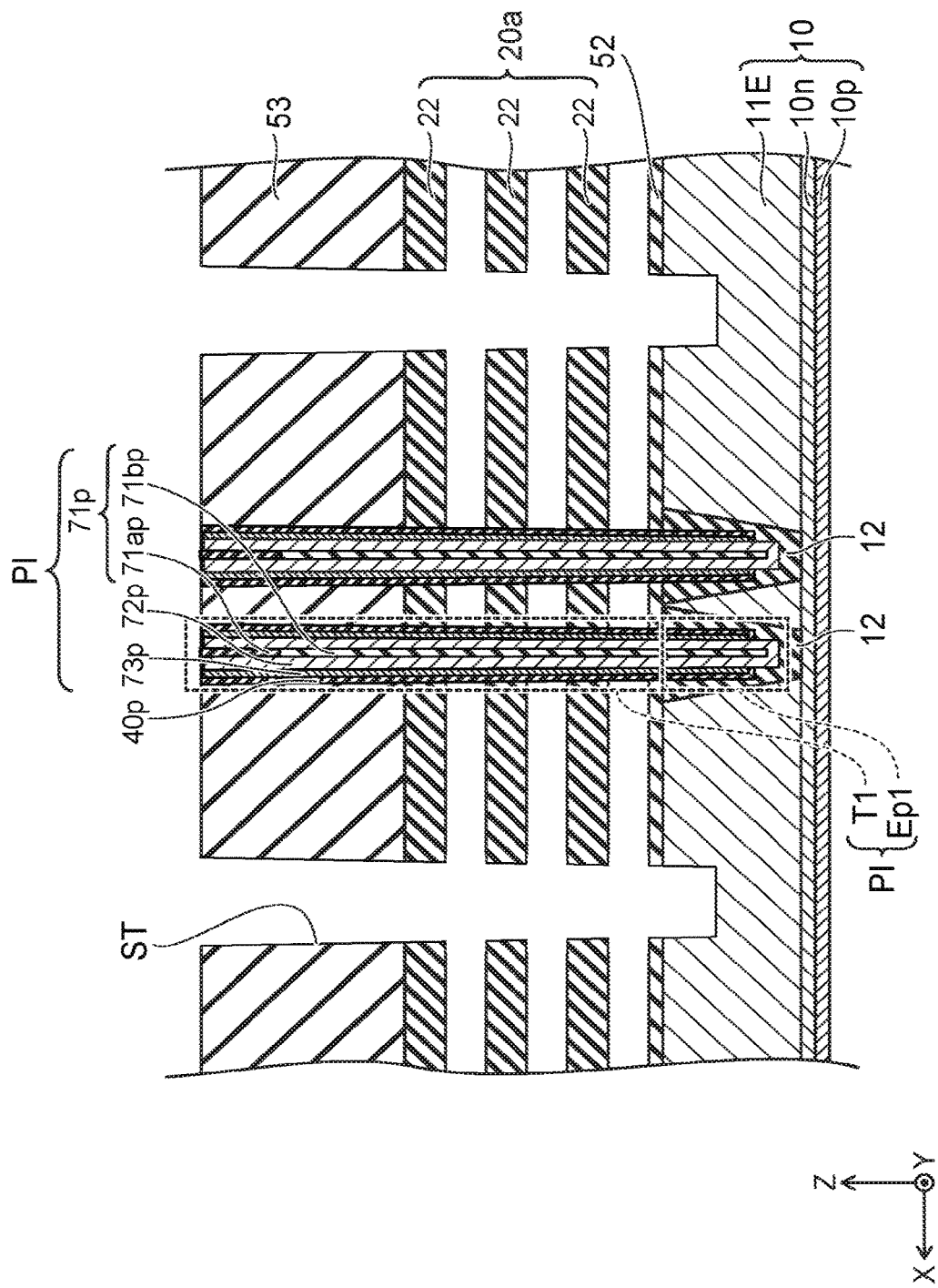
Figure 15:
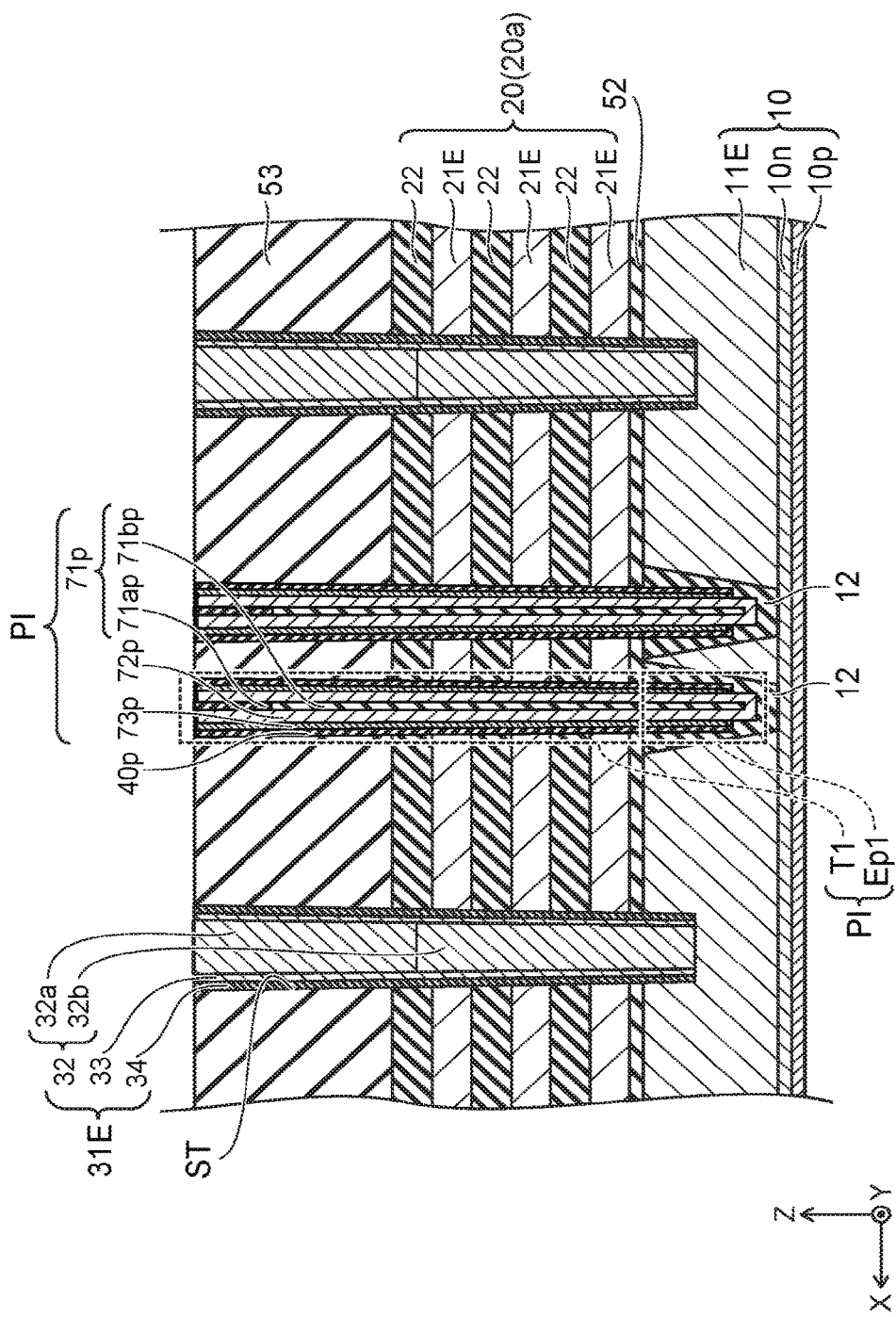

FIG. 13 to FIG. 15 are schematic cross-sectional views along line E1-E2 shown in FIG. 1.

As shown in FIG. 13, etching of the stacked body 20a and the insulating film 53 is performed. Thereby, a slit ST that pierces the insulating film 53 and the stacked body 20 in the Z-direction and extends along the Y-direction is made.

As shown in FIG. 14, the filled film 21a is removed via the slit ST. For example, the filled film 21a is removed by wet etching using a phosphoric acid solution ($H_3PO_4$). A space is made between the insulating films 22 separated from each other in the Z-direction by removing the filled film 21a. In such a case, the pillar PI supports the insulating films 22. In other words, the first pillar PI is used as a pillar that connects the substrate 10 and the multiple insulating films 22 and suppresses the collapse of the structure. Inside the p-type well 11E, for example, the first pillar PI is formed to be deeper than the second pillar SP. The strength of the pillar of the first pillar PI is high; and, for example, the structure does not deform easily due to a force in a direction intersecting the Z-direction.

As shown in FIG. 15, for example, the conductive film 21E is formed by depositing tungsten via the slit ST in the space where the filled film 21a was removed. The insulating film 34 is formed on the inner surface along the YZ plane of the slit ST. The barrier metal film 33 is formed on the insulating film 34. The conductive film 32b is formed inside the slit ST. Etch-back of the conductive film 32b is performed. The conductive film 32a is formed inside the slit ST and on the conductive film 32b.

In the method for manufacturing the semiconductor memory device according to the first embodiment as shown in FIG. 14, a space is made between the insulating films 22 separated from each other in the Z-direction where the filled film 21a was removed. In such a case, the first pillar PI supports the insulating films 22. Also, as shown in FIG. 2, inside the p-type well 11E, the first pillar PI enters deeper than the second pillar SP. Thereby, the strength of the pillar of the first pillar PI is high; and, for example, the orientation of the insulating films 22 can be maintained when a force is applied from a direction intersecting the Z-direction.

Thereby, a semiconductor memory device and a method for manufacturing the semiconductor memory device in which it is possible to increase the reliability can be provided.

In the method for manufacturing the semiconductor memory device according to the first embodiment, the formation of the first pillar PI is performed with the formation of the second pillar SP (Referring to FIG. 7 to FIG. 12). Accordingly, it is unnecessary to add a process of making the first pillar PI. Thereby, the manufacturing processes of the semiconductor memory device 110 can be reduced.

Second Embodiment

Figure 16A:
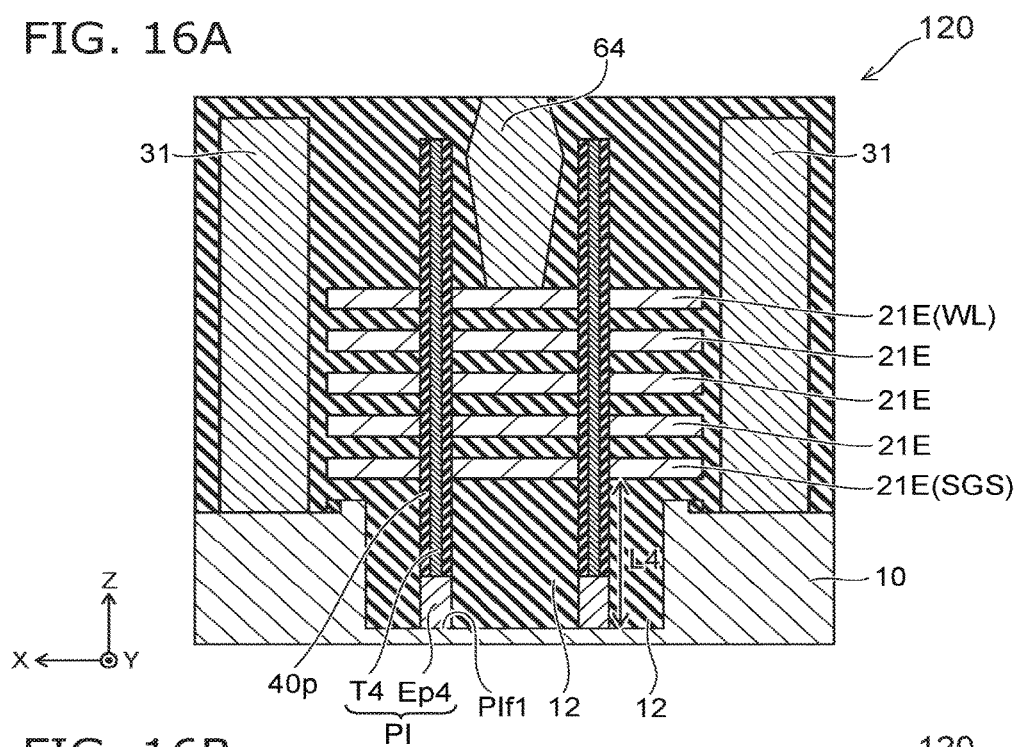
FIGS. 16A and 16B are schematic cross-sectional views showing a semiconductor memory device according to a second embodiment.
Figure 16B:
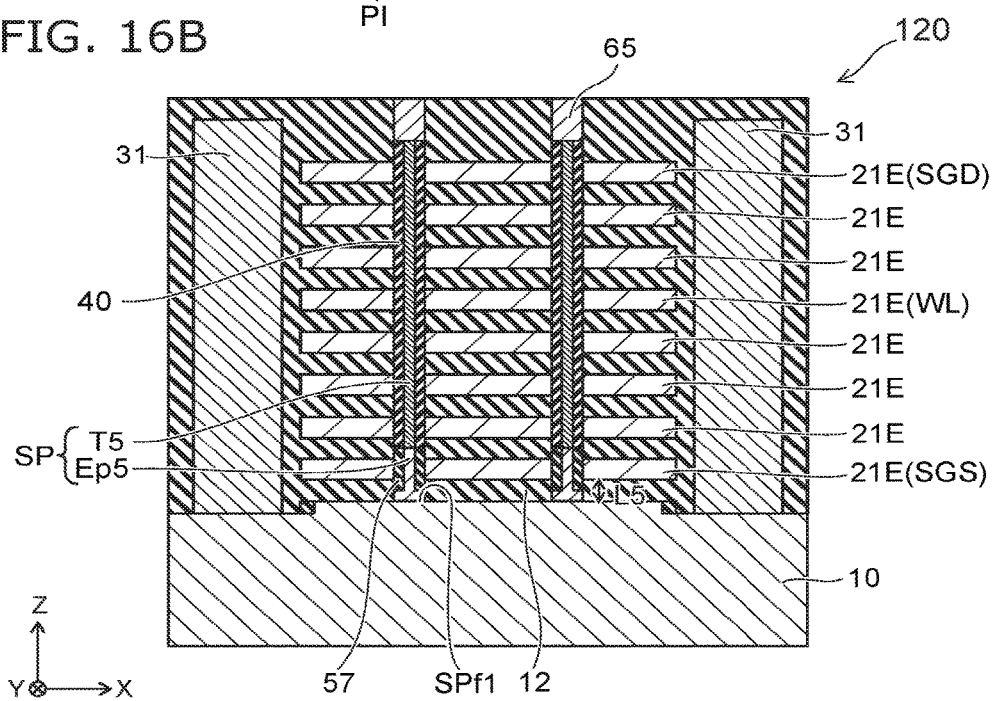

FIG. 16A and FIG. 16B are schematic cross-sectional views showing a semiconductor memory device according to a second embodiment.

FIG. 16A corresponds to a schematic cross-sectional view along line E1-E2 shown in FIG. 1.

FIG. 16B corresponds to a schematic cross-sectional view along line F1-F2 shown in FIG. 1.

Figure 17:
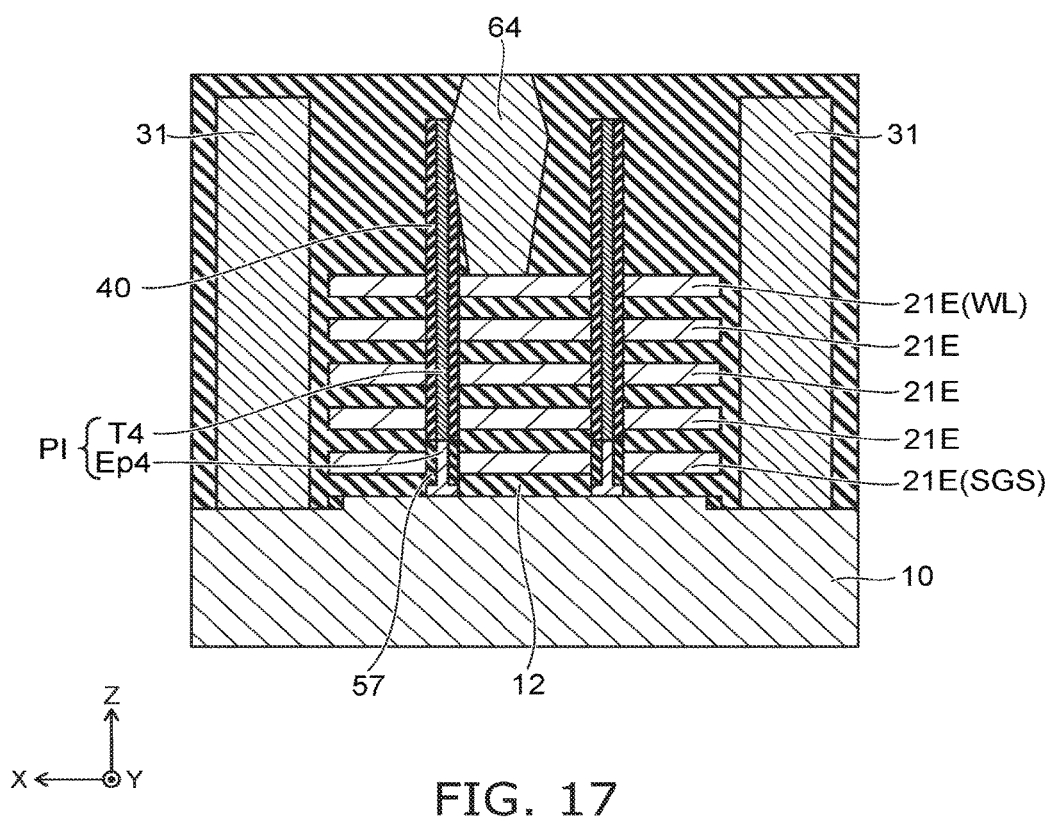
FIG. 17 is a schematic cross-sectional view showing a semiconductor memory device in the case where the contact is in contact with the first pillar PI.

FIG. 17 is a schematic cross-sectional view showing a semiconductor memory device in the case where the contact is in contact with the first pillar PI.

As shown in FIG. 16A, the first pillar PI reaches the substrate 10 in the semiconductor memory device 120 according to the second embodiment. In other words, the first pillar PI reaches the bottom of the STI. The first pillar PI has a first pillar first surface PIf1 that contacts the substrate 10. The second pillar SP has a second pillar first surface SPf1 that contacts the substrate 10.

In the semiconductor memory device 120 according to the second embodiment, a fourth length L4 from the first pillar first surface PIf1 to the source-side selection gate electrode SGS is longer than a fifth length L5 from the second pillar first surface SPf1 to the source-side selection gate electrode SGS.

FIG. 17 is a drawing showing a comparative example of the second embodiment. As shown in FIG. 17, there is a possibility that the contact 64 may contact the first pillar PI. For example, there is a possibility that the contact 64 may contact the first pillar PI if the alignment precision of the exposure is low, distortion due to stress occurs, the configuration of the contact is a bowed configuration, etc.

In such a case, a leakage current flows from the contact portion via the first pillar PI to the substrate 10. Due to the leakage current, there is a possibility that the voltage cannot be applied to the word line (the conductive film 21E) and the operations of the cell (the programming and the reading) cannot be performed.

Therefore, in the semiconductor memory device 120 according to the second embodiment, an epitaxial silicon pillar (a fourth lower end portion Ep4) is included at the lower portion of the first pillar PI. The epitaxial silicon pillar is disposed lower than the source-side selection gate electrode SGS. Here, the epitaxial silicon pillar includes so-called non-doped silicon having little impurities. That is, the first pillar PI is electrically connected to the substrate 10 via the epitaxial silicon pillar that has a high electrical resistance.

In other words, the resistance between the first pillar PI and the substrate 10 is high; and in the case where the contact 64 contacts the first pillar PI (referring to FIG. 17), the leakage current from the contact 64 via the first pillar PI into the substrate 10 can be suppressed. As a result, a semiconductor memory device in which it is possible to increase the reliability can be provided.

According to the embodiments, a semiconductor memory device and a method for manufacturing the semiconductor memory device in which it is possible to increase the reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a foundation member, at least a portion of an upper layer portion of the foundation member being conductive;
   a first insulating film provided in a portion of the foundation member;
   a stacked body provided on the foundation member and on the first insulating film, the stacked body including conductive films and insulating films stacked alternately in a first direction, the stacked body including a second region, and a first region disposed on a second-direction side of the second region, the second direction intersecting the first direction, a configuration of the first region being a stairstep configuration; and a first pillar piercing the stacked body in the first direction, the first pillar including a first lower end portion and a first extension portion, the first lower end portion being disposed inside the first insulating film, the first extension portion being disposed inside the stacked body, the first extension portion being disposed in the first region.

2. The semiconductor memory device according to claim 1, further comprising a second pillar piercing the second region in the first direction, the second pillar including a second lower end portion and a second extension portion, the second lower end portion being disposed inside the foundation member, the second extension portion being disposed inside the stacked body.

3. The semiconductor memory device according to claim 2, wherein a first length along the first direction of the first lower end portion is longer than a second length along the first direction of the second lower end portion.

4. The semiconductor memory device according to claim 3, wherein the first length is not less than 10 times the second length.

5. The semiconductor memory device according to claim 2, wherein
the foundation member contacts the first insulating film, and
the foundation member contacts the second lower end portion.

6. The semiconductor memory device according to claim 3, wherein
the first insulating film includes silicon oxide, and
one of the foundation member, the first pillar, and the second pillar includes silicon.

7. The semiconductor memory device according to claim 3, wherein the first pillar includes a material included in the second pillar.

8. The semiconductor memory device according to claim 2, further comprising a first memory film provided between the stacked body and the second pillar,
the first memory film including:
a first inner insulating film;
a first intermediate film; and
a first outer insulating film;
the first outer insulating film being provided between the second pillar and the stacked body,
the first intermediate film being provided between the first outer insulating film and the second pillar,
the first inner insulating film being provided between the first intermediate film and the second pillar.

9. The semiconductor memory device according to claim 8, further comprising a second memory film provided between the stacked body and the first pillar,
the second memory film including:
a second inner insulating film;
a second intermediate film; and
a second outer insulating film;
the second outer insulating film being provided between the first pillar and the stacked body and including a material included in the first outer insulating film,
the second intermediate film being provided between the second outer insulating film and the first pillar and including a material included in the first intermediate film,
the second inner insulating film being provided between the second intermediate film and the first pillar and including a material included in the first inner insulating film.

10. The semiconductor memory device according to claim 1, further comprising an electrode film spreading along the first direction and the second direction and including a third lower end portion and a third extension portion, the third lower end portion being disposed inside the first insulating film, the third extension portion being disposed inside the stacked body.

11. The semiconductor memory device according to claim 1, wherein the first pillar is insulated from the foundation member.

12. The semiconductor memory device according to claim 2, wherein
the first pillar has a first pillar first surface contacting the foundation member,
the second pillar has a second pillar first surface contacting the foundation member, and
a fourth length from the first pillar first surface to one of the conductive films is longer than a fifth length from the second pillar first surface to the one of the conductive films.

* * * * *